United States Patent
Lin et al.

(10) Patent No.: US 10,937,722 B1
(45) Date of Patent: Mar. 2, 2021

(54) DEVICE SUBSTRATE

(71) Applicant: Au Optronics Corporation, Hsinchu (TW)

(72) Inventors: Ming-Wei Lin, Hsinchu (TW);
Pin-Miao Liu, Hsinchu (TW);
Yung-Hsiang Lan, Hsinchu (TW);
Wen-Hui Lee, Hsinchu (TW);
Kung-Cheng Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/931,543

(22) Filed: May 13, 2020

(30) Foreign Application Priority Data

Sep. 27, 2019 (TW) .................................. 108135045

(51) Int. Cl.
*H01L 23/00* (2006.01)
*H01L 23/498* (2006.01)

(52) U.S. Cl.
CPC .. *H01L 23/49838* (2013.01); *H01L 23/49811* (2013.01); *H01L 23/49833* (2013.01); *H01L 24/16* (2013.01); *H01L 2224/16227* (2013.01)

(58) Field of Classification Search
CPC .............................................. H01L 23/49838
USPC ....................................................... 174/255
See application file for complete search history.

(56) References Cited

U.S. PATENT DOCUMENTS

| | | | | |
|---|---|---|---|---|
| 5,343,616 A * | 9/1994 | Roberts | .................. | H01R 31/00 29/846 |
| 5,418,691 A * | 5/1995 | Tokura | .................. | H01R 12/62 174/254 |
| 5,541,814 A * | 7/1996 | Janai | .................. | H01L 23/5382 174/255 |
| 6,668,449 B2 * | 12/2003 | Rumsey | ................ | H01L 23/544 29/840 |
| 2002/0162686 A1 * | 11/2002 | Chen | ...................... | H01C 7/003 174/261 |
| 2006/0118329 A1 * | 6/2006 | Nakamura | ............. | H05K 1/115 174/260 |
| 2007/0268441 A1 * | 11/2007 | Liu | ...................... | G02F 1/13452 349/149 |

(Continued)

FOREIGN PATENT DOCUMENTS

CN 105093728 11/2015
CN 109301541 2/2019
(Continued)

*Primary Examiner* — Stanley Tso
(74) *Attorney, Agent, or Firm* — JCIPRNET

(57) ABSTRACT

A device substrate includes a first substrate, a second substrate, a plurality of first bonding pads, a plurality of second bonding pads, a plurality of first leads, and a plurality of second leads. The first and second bonding pads are separated from each other. The first bonding pads are arranged in a first column. The second bonding pads are arranged in a second column. The first and second leads respectively overlap the first and second bonding pads. The first lead includes a first extension portion and a first branch portion. The first extension portion extends from the first column to the second column. The first branch portion is connected to an end of the first extension portion close to the second column. An angle is present between the first extension portion and the first branch portion.

16 Claims, 5 Drawing Sheets

(56) References Cited

U.S. PATENT DOCUMENTS

| | | | | |
|---|---|---|---|---|
| 2008/0073784 | A1* | 3/2008 | Lee | H05K 1/0271 |
| | | | | 257/738 |
| 2009/0025964 | A1* | 1/2009 | Lee | H05K 1/029 |
| | | | | 174/255 |
| 2009/0266584 | A1* | 10/2009 | Tsumura | H01L 23/3735 |
| | | | | 174/252 |
| 2010/0051326 | A1 | 3/2010 | Sagisaka | |
| 2010/0307799 | A1* | 12/2010 | Chiang | H05K 3/108 |
| | | | | 174/255 |
| 2011/0051068 | A1* | 3/2011 | Kamon | H05K 3/368 |
| | | | | 349/152 |
| 2011/0080383 | A1* | 4/2011 | Huang | G02F 1/13454 |
| | | | | 345/204 |
| 2012/0097432 | A1* | 4/2012 | Huang | H05K 1/117 |
| | | | | 174/254 |
| 2016/0043054 | A1* | 2/2016 | Fischer | H01L 25/18 |
| | | | | 438/107 |
| 2020/0168697 | A1* | 5/2020 | Jang | H01L 25/0753 |

FOREIGN PATENT DOCUMENTS

| | | |
|---|---|---|
| TW | 200737473 | 10/2007 |
| TW | 200744185 | 12/2007 |
| TW | 201010536 | 3/2010 |
| TW | I392948 | 4/2013 |
| TW | I418906 | 12/2013 |

\* cited by examiner

DEVICE SUBSTRATE

CROSS-REFERENCE TO RELATED APPLICATION

This application claims the priority benefit of Taiwan application serial no. 108135045, filed on Sep. 27, 2019. The entirety of the above-mentioned patent application is hereby incorporated by reference herein and made a part of this specification.

BACKGROUND

Technical Field

The disclosure relates to a device substrate, and in particular, to a device substrate including bonding pads and leads.

Description of Related Art

Chip on film (COF) is a technology for packaging a chip on a flexible printed circuit (FPC) board through flip chip bonding. Currently, a chip is bonded to leads on a flexible substrate circuit mainly through thermal compression bonding.

The COF exhibits light, thin, and flexible characteristics. Therefore, a drive chip for a high-end display device usually uses the COF technology. Generally, the COF is bonded to a substrate of the display device through press fitting. However, when the COF is press-fitted to the substrate of the display device, a film layer on the substrate may be easily deformed due to pressure and temperature.

SUMMARY

The disclosure provides a device substrate, which is not easily deformed in a press-fitting process of first bonding pads and first leads.

At least one embodiment of the disclosure provides a device substrate. The device substrate includes a first substrate, a second substrate, a plurality of bonding pads, and a plurality of connection ends. The second substrate faces the first substrate. The plurality of bonding pads are separated from each other and located on the first substrate, and include a plurality of first bonding pads and a plurality of second bonding pads. The first bonding pads are arranged in a first column. The second bonding pads are arranged in a second column. The connection ends are located on the second substrate, and include a plurality of first leads and a plurality of second leads. The plurality of first leads and the plurality of second leads respectively overlap the first bonding pads and the second bonding pads. The first lead includes a first extension portion and a first branch portion. The first extension portion overlaps the corresponding first bonding pad, and extends from the first column to the second column. The first branch portion is connected to an end of the first extension portion close to the second column, and forms an angle with the first extension portion.

DESCRIPTION OF THE EMBODIMENTS

Figure 1A:
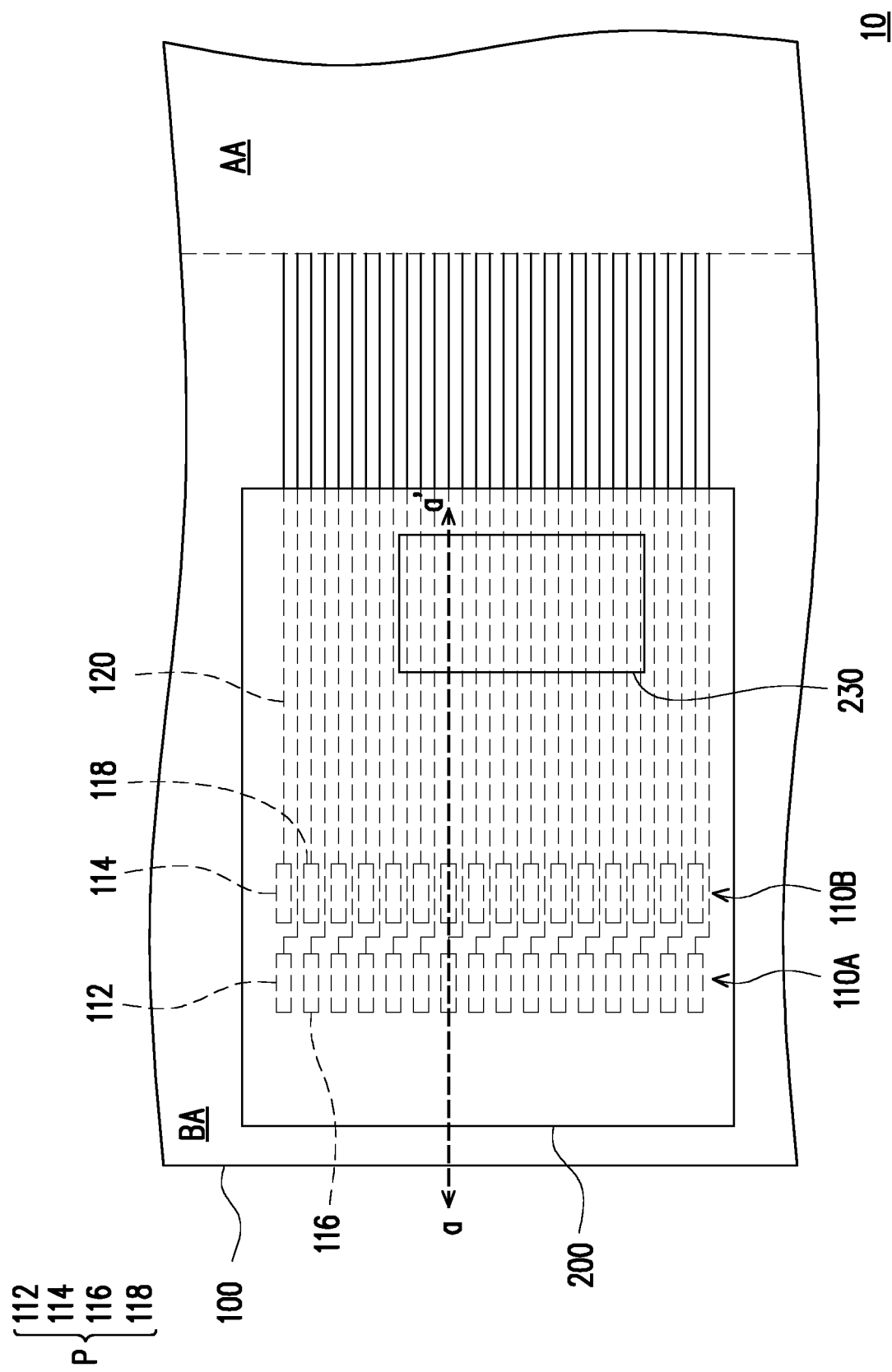
FIG. 1A is a schematic top view of a device substrate according to an embodiment of the disclosure.
Figure 1B:
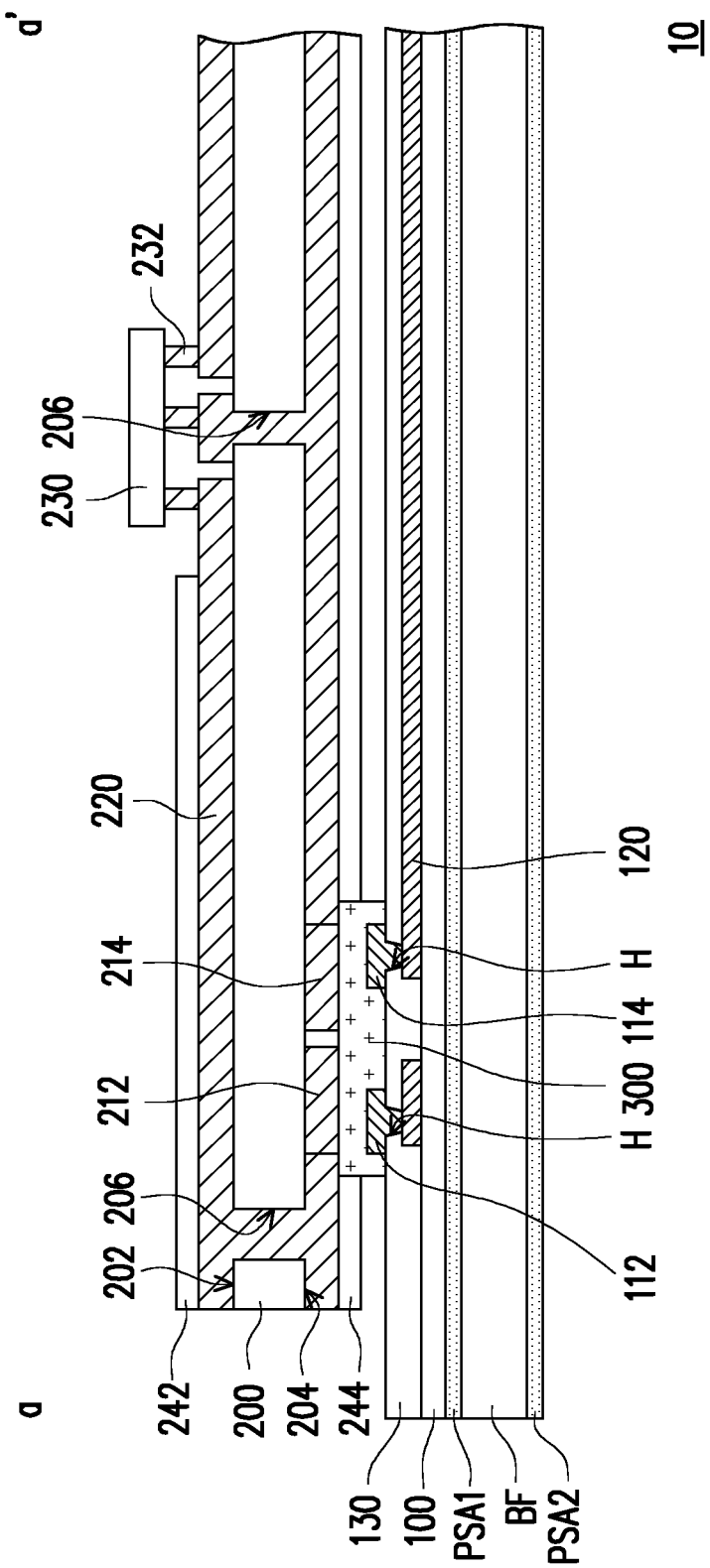
FIG. 1B is a schematic diagram of a cross section along a line aa' in FIG. 1A.
Figure 1C:
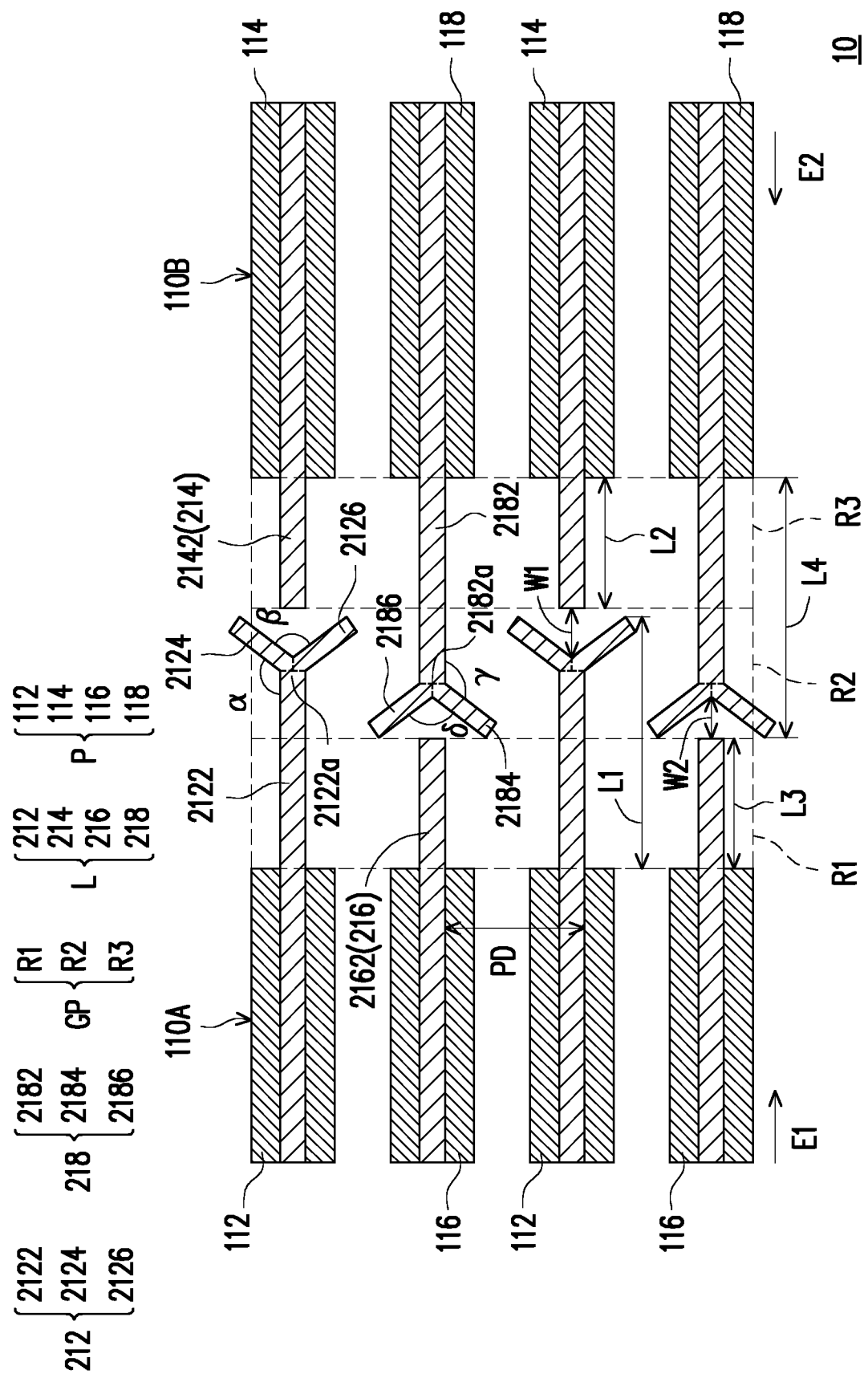
FIG. 1C is a schematic top view of a device substrate according to an embodiment of the disclosure.

FIG. 1A is a schematic top view of a device substrate according to an embodiment of the disclosure. FIG. 1B is a schematic diagram of a cross section along a line aa' in FIG. 1A. FIG. 1C is a schematic top view of a device substrate according to an embodiment of the disclosure. For ease of description, FIG. 1A shows a first substrate, a second substrate, a chip, and bonding pads, and omits other components. For ease of description, FIG. 1C shows bonding pads and connection ends, and omits other components.

Referring to FIG. 1A, FIG. 1B, and FIG. 1C, a device substrate 10 includes a first substrate 100, a second substrate 200, a plurality of bonding pads P, and a plurality of connection ends L.

In the present embodiment, the first substrate 100 includes an active area AA and a border area BA. The border area BA is located on at least one side of the active area AA. In some embodiments, the device substrate 10 is a display device, and the active area AA is a display area, but the disclosure is not limited thereto.

The first substrate 100 may be made of glass, an organic polymer, or other suitable materials. In the present embodiment, the first substrate 100 may be a flexible substrate made of polyimide (PI). In the present embodiment, the first substrate 100 is connected to a carrier substrate BF by using an adhesive material PSA1, and the carrier substrate BF may be connected to another component, for example, a metal plate, a plastic substrate, or a housing, by using an adhesive material PSA2, but the disclosure is not limited thereto.

The bonding pads P are separated from each other and located in the border area BA of the first substrate 100. In the present embodiment, the bonding pads P include first bonding pads 112, second bonding pads 114, third bonding pads 116, and fourth bonding pads 118. The first bonding pads 112, the second bonding pads 114, the third bonding pads 116, and the fourth bonding pads 118 are electrically connected to corresponding conducting wires 120. The conducting wires 120 extend from the border area BA to the active area AA.

In the present embodiment, the first bonding pads 112, the second bonding pads 114, the third bonding pads 116, and the fourth bonding pads 118 belong to a same film layer, and the conducting wires 120 belong to another film layer different from that of the first bonding pads 112, the second bonding pads 114, the third bonding pads 116, and the fourth bonding pads 118.

In the present embodiment, an insulation layer 130 is located on the first substrate 100, and located between the conducting wires 120 and the first bonding pads 112 and between the conducting wires 120 and the second bonding pads 114. The insulation layer 130 has a plurality of holes H, and the first bonding pads 112 and the second bonding pads 114 are electrically connected to the corresponding conducting wires 120 through the holes H.

The first bonding pads 112 are arranged in a first column 110A, and the second bonding pads 114 are arranged in a second column 110B. In the present embodiment, the first bonding pads 112 and the third bonding pads 116 are arranged in the first column 110A, and the second bonding pads 114 and the fourth bonding pads 118 are arranged in the second column 110B. In the present embodiment, an end of each first bonding pad 112 facing the second column 110B is aligned with an end of each third bonding pad 116 facing the second column 110B, and an end of each second bonding pad 114 facing the first column 110A is aligned with an end of each fourth bonding pad 118 facing the first column 110A.

In the present embodiment, the first bonding pads 112 and the third bonding pads 116 have a same extension direction E1, and the second bonding pads 114 and the fourth bonding pads 118 have a same extension direction E2. In the present embodiment, the extension direction E1 is parallel to the extension direction E2. In the present embodiment, the first bonding pads 112 are aligned with the second bonding pads 114 in the extension direction E1 of (or the extension direction E2), and the third bonding pads 116 are aligned with the fourth bonding pads 118 in the extension direction E1 of (or the extension direction E2).

The second substrate 200 faces the first substrate 100. A plurality of connection ends L, a plurality of cables 220, and a chip 230 are located on the second substrate 200. The connection ends L include a plurality of first leads 212, a plurality of second leads 214, a plurality of third leads 216, and a plurality of fourth leads 218. The chip 230 is electrically connected to the plurality of cables 220 by using a plurality of conductive bumps 232, and respectively electrically connected to the first leads 212, the second leads 214, the third leads 216, and the fourth leads 218 by using the plurality of cables 220.

In the present embodiment, the chip 230 is located on a first surface 202 of the second substrate 200, and the first leads 212, the second leads 214, the third leads 216, and the fourth leads 218 are located on a second surface 204 of the second substrate 200. The first surface 202 is opposite to the second surface 204. In the present embodiment, some cables 220 are located on the first surface 202, and some cables 220 are located on the second surface 204. The cables 220 located on the first surface 202 are electrically connected to the cables 220 located on the second surface 204 via through holes 206. The through holes 206 penetrate at least the second substrate 200. In the present embodiment, a protective layer 242 and a protective layer 244 are respectively located on the first surface 202 and the second surface 204 of the second substrate 200, and cover some cables 220.

In the present embodiment, the chip 230 is packaged on the second substrate 200 by using a COF technology.

Pressure is exerted to the first leads 212, the second leads 214, the third leads 216, and the fourth leads 218, so that the first leads 212, the second leads 214, the third leads 216, and the fourth leads 218 respectively overlap and are electrically connected to the first bonding pads 112, the second bonding pads 114, the third bonding pads 116, and the fourth bonding pads 118. In the present embodiment, a conducting material 300 is located between the bonding pads P and the connection ends L. In the present embodiment, the conducting material 300 is an anisotropic conductive film (ACF), and the conducting material 300 includes resin and conductive particles.

The first lead 212 includes a first extension portion 2122 and a first branch portion 2124. The first extension portion 2122 overlaps a corresponding first bonding pad 112, and extends from the first column 110A to the second column 110B. The first branch portion 2124 is connected to an end 2122a of the first extension portion 2122 close to the second column 110B, and forms an angle α with the first extension portion 2122.

In the present embodiment, the first lead 212 further includes a first divergent portion 2126. The first divergent portion 2126 is connected to the end 2122a of the first extension portion 2122 close to the second column 110B, and forms an angle β with the first branch portion 2124. In the present embodiment, the angle β between the first branch portion 2124 and the first divergent portion 2126 is 10 degrees to 180 degrees. As the first branch portion 2124 and the first divergent portion 2126 are disposed, stress between the first bonding pad 112 and the second bonding pad 114 may be dispersed, so that the device substrate 10 is not easily deformed in a press-fitting process.

The second lead 214 includes a second extension portion 2142. The second extension portion 2142 overlaps a corresponding second bonding pad 114, and extends from the second column 110B to the first column 110A.

The third lead 216 includes a third extension portion 2162. The third extension portion 2162 overlaps a corresponding third bonding pad 116, and extends from the first column 110A to the second column 110B.

The fourth lead 218 includes a fourth extension portion 2182 and a fourth branch portion 2184. The fourth extension portion 2182 overlaps a corresponding fourth bonding pad 118, and extends from the second column 110B to the first column 110A. The fourth branch portion 2184 is connected to an end 2182a of the fourth extension portion 2182 close to the first column 110A, and forms an angle γ with the fourth extension portion 2182.

In the present embodiment, the fourth lead 218 further includes a fourth divergent portion 2186. The fourth divergent portion 2186 is connected to the end 2182a of the fourth extension portion 2182 close to the first column 110A, and forms an angle δ with the fourth branch portion 2184. In the present embodiment, the angle δ between the fourth branch portion 2184 and the fourth divergent portion 2186 is 10 degrees to 180 degrees. As the fourth branch portion 2184 and the first fourth portion 2186 are disposed, stress between the third bonding pad 116 and the fourth bonding pad 118 may be dispersed, so that the device substrate 10 is not easily deformed in the press-fitting process.

In the present embodiment, a minimum spacing between two adjacent connection ends L is greater than 4 micrometers and less than 80 micrometers. This may resolve a problem of stress concentration in the press-fitting process and avoid short-circuiting of adjacent leads. When the minimum spacing between two adjacent connection ends L is greater than 80 micrometers, a gap between adjacent connection ends L is easily deformed in the press-fitting process. If utilization of cabling space is considered, a spacing between two adjacent connection ends L is greater than 10 micrometers and less than 30 micrometers, or is greater than 10 micrometers and less than 20 micrometers.

In the present embodiment, widths of the first extension portion 2122, the second extension portion 2142, the third extension portion 2162, and the fourth extension portion 2182 range from 6 micrometers to PD-4 micrometers, where PD is a spacing between two adjacent extension portions in a same column (for example, the first column 110A or the second column 110B).

In the present embodiment, a gap GP is present between the first column 110A and second column 110B. In the present embodiment, a length L1 of the first lead 212 overlapping the gap GP is different from a length L3 of the third lead 216 overlapping the gap GP, and a length L2 of the second lead 214 overlapping the gap GP is different from a length L4 of the fourth lead 218 overlapping the gap GP. In the present embodiment, the length L1 of the first lead 212 overlapping the gap GP is greater than the length L3 of the third lead 216 overlapping the gap GP, and the length L4 of the fourth lead 218 overlapping the gap GP is greater than the length L2 of the second lead 214 overlapping the gap GP. An interval W1 between the first lead 212 and the second lead 214 is staggered with an interval W2 between the third lead 216 and the fourth lead 218. In other words, the end 2122a of the first extension portion 2122 close to the second column 110B is staggered with the end 2182a of the fourth extension portion 2182 close to the first column 110A. This may evenly disperse weak points where stress concentrates, and avoid deformation of the device substrate 10 in the press-fitting process.

In the present embodiment, a sum of the length L1 and the length L3 is equal to a sum of the length L2 and the length L4. This may evenly distribute pressure exerted in the press-fitting process.

In the present embodiment, the gap GP includes a first region R1, a second region R2, and a third region R3 that have a same area and are connected in sequence. The first region R1 is located between the first column 110A and the second region R2. The third region R3 is located between the second column 110B and the second region R2. An area of the connection end L overlapping the first region R1 is B', an area of the connection end L overlapping the second region R2 is A, and an area of the connection end L overlapping the third region R3 is B. The area B and the area B' may be the same or different. In the present embodiment, 1<A/B<1.93. This may better disperse stress in the press-fitting process, and improve the utilization of the cabling space. In some embodiments, 1<A/B'<1.93.

In the present embodiment, areas of all the first region R1, the second region R2, and the third region R3 are AR, and 0.15≤(A+B+B')3AR<1/3.

Based on the above, the first lead 212 of the device substrate 10 includes the first extension portion 2122 and the first branch portion 2124, and an angle is present between the first branch portion 2124 and the first extension portion 2122. Therefore, a problem of deformation in a region between the first bonding pads 112 and the second bonding pads 114 in a press-fitting process of the first bonding pads 112 on the first substrate 100 and the first leads 212 on the second substrate 200 of the device substrate 10 may be resolved, and a desired effect may be achieved in this design range.

Figure 2:
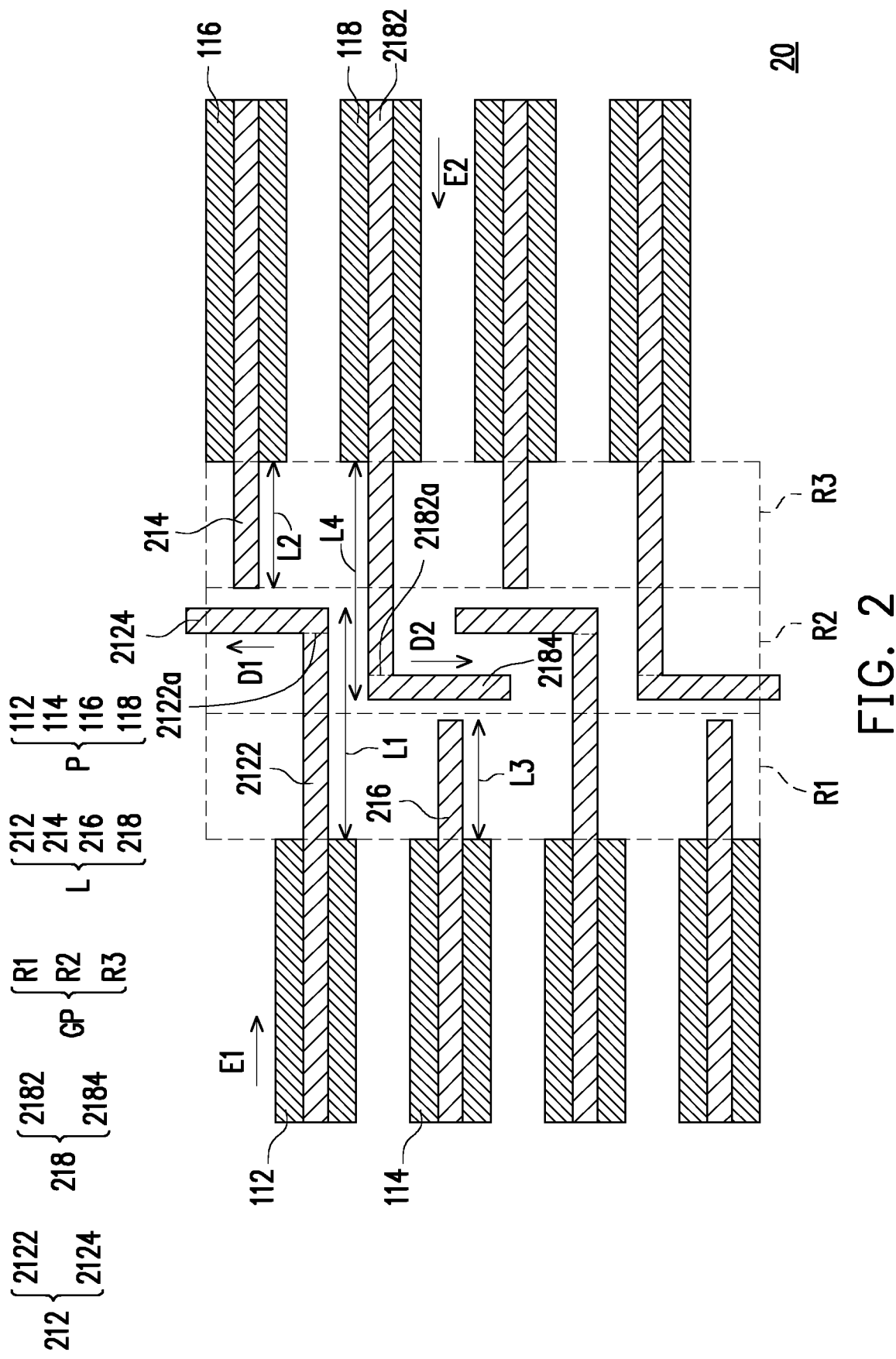
FIG. 2 is a schematic top view of a device substrate according to an embodiment of the disclosure.

FIG. 2 is a schematic top view of a device substrate according to an embodiment of the disclosure. It should be noted herein that, the embodiment of FIG. 2 follows reference numerals of components and some content in the embodiment of FIG. 1A to FIG. 1C, where the same or similar reference numerals are used to represent the same or similar components and the descriptions of the same technical content are omitted. For the explanation of the omitted part, reference may be made to the preceding embodiment and the descriptions thereof are omitted herein.

A main difference between a device substrate 20 in FIG. 2 and the device substrate 10 in FIG. 1C is as follows: Shapes of a first lead 212 and a fourth lead 218 of the device substrate 20 are different from shapes of the first lead 212 and the fourth lead 218 of the device substrate 10.

Referring to FIG. 2, in the present embodiment, the first lead 212 includes a first extension portion 2122 and a first branch portion 2124. The first extension portion 2122 overlaps a corresponding first bonding pad 112, and extends from a first column 110A to a second column. The first branch portion 2124 is connected to an end 2122a of the first extension portion 2122 close to the second column, and forms a right angle with the first extension portion 2122. This may disperse stress and effectively prevent deformation of a first substrate in a press-fitting process.

The fourth lead 218 includes a fourth extension portion 2182 and a fourth branch portion 2184. The fourth extension portion 2182 overlaps a corresponding fourth bonding pad 118, and extends from the second column to the first column. The fourth branch portion 2184 is connected to an end 2182a of the fourth extension portion 2182 close to the first column, and forms a right angle with the fourth extension portion 2182. This may effectively prevent deformation of the first substrate in the press-fitting process.

In the present embodiment, the first lead 212 is bent to a first direction D1. In the present embodiment, the first extension portion 2122 extends along a first extension direction E1, and the first branch portion 2124 extends along the first direction D1. The fourth lead 218 is bent to a second direction D2. In the present embodiment, the fourth extension portion 2182 extends along a second extension direction E2, and the fourth branch portion 2184 extends along the second direction D2. The first direction D1 is different from the second direction D2. In the present embodiment, the first direction D1 is opposite to the second direction D2.

In the present embodiment, the first bonding pad 112 is staggered with the second bonding pad 114. In other words, the first bonding pad 112 is not aligned with the second bonding pad 114 in the extension direction E1 (or the extension direction E2). A third bonding pad 116 is staggered with a fourth bonding pad 118. In other words, the third bonding pad 116 is not aligned with the fourth bonding pad 118 in the extension direction E1 (or the extension direction E2).

In the present embodiment, a gap GP is present between the first column and the second column. In the present embodiment, a length L1 of the first lead 212 overlapping the gap GP is different from a length L3 of the third lead 216 overlapping the gap GP, and a length L2 of the second lead 214 overlapping the gap GP is different from a length L4 of the fourth lead 218 overlapping the gap GP.

In the present embodiment, the gap GP includes a first region R1, a second region R2, and a third region R3 that have a same area and are connected in sequence. The first region R1 is located between the first column 110A and the second region R2. The third region R3 is located between the second column 110B and the second region R2. An area of a connection end L overlapping the first region R1 is B', an area of the connection end L overlapping the second region R2 is A, and an area of the connection end L overlapping the third region R3 is B. The area B and the area B' may be the same or different. In the present embodiment, 1<A/B<2.04, which may better disperse the stress in the press-fitting process, and improve utilization of cabling space. In some embodiments, 1<A/B'<2.04.

In the present embodiment, areas of all the first region R1, the second region R2, and the third region R3 are AR, and 0.2≤(A+B+B'3AR<1/2.

Based on the above, the first lead 212 of the device substrate 20 includes the first extension portion 2122 and the first branch portion 2124, and an angle is present between the first branch portion 2124 and the first extension portion 2122. Therefore, a problem of deformation in a region between the first bonding pad 112 and the second bonding pad 114 in a press-fitting process of the first bonding pad 112 on the first substrate and the first lead 212 on a second substrate of the device substrate 20 may be resolved, and a desired effect may be achieved in this design range.

Figure 3:
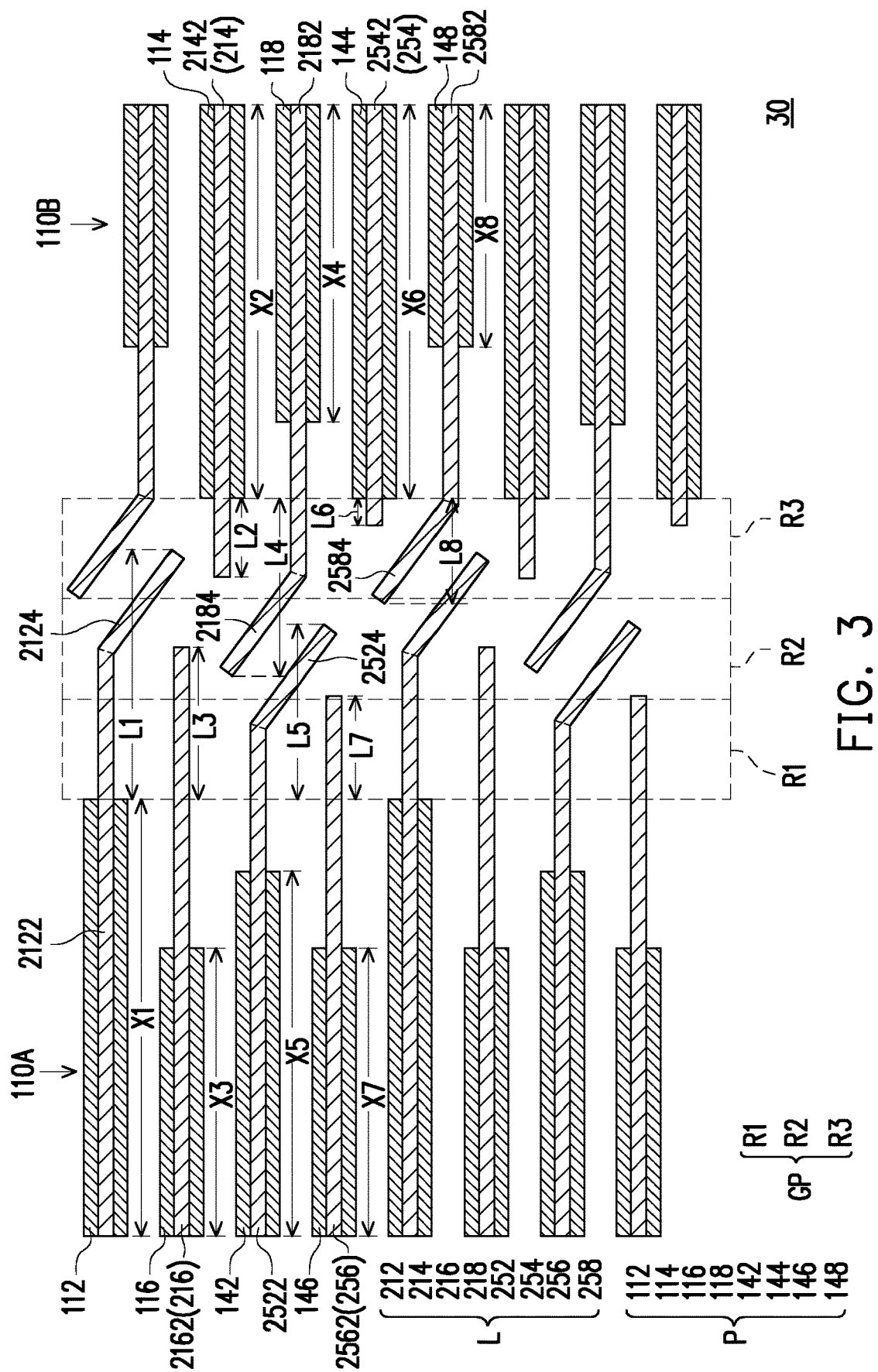
FIG. 3 is a schematic top view of a device substrate according to an embodiment of the disclosure.

FIG. 3 is a schematic top view of a device substrate according to an embodiment of the disclosure. It should be noted herein that, the embodiment of FIG. 3 follows reference numerals of components and some content in the embodiment of FIG. 2, where the same or similar reference numerals are used to represent the same or similar components and the descriptions of the same technical content are omitted. For the explanation of the omitted part, reference may be made to the preceding embodiment and the descriptions thereof are omitted herein.

A main difference between a device substrate 30 and the device substrate 20 is as follows: Bonding pads P of the device substrate 30 further include a plurality of fifth bonding pads 142, a plurality of sixth bonding pads 144, a plurality of seventh bonding pads 146, and a plurality of eighth bonding pads 148, and connection ends L of the device substrate 30 further include a plurality of fifth leads 252, a plurality of sixth leads 254, a plurality of seventh leads 256, and a plurality of eighth leads 258.

In the present embodiment, first bonding pads 112, third bonding pads 116, the fifth bonding pads 142, and the seventh bonding pads 146 are arranged in a first column 110A, and second bonding pads 114, fourth bonding pads 118, the sixth bonding pads 144, and the eighth bonding pads 148 are arranged in a second column 110B. In the present embodiment, an end of the first bonding pad 112 facing the second column 110B is not aligned with ends of the third bonding pad 116, the fifth bonding pad 142, and the seventh bonding pad 146 facing the second column 110B, and an end of the second bonding pad 114 facing the first column 110A is not aligned with ends of the fourth bonding pad 118 and the eighth bonding pad 148 facing the first column 110A. In the present embodiment, the end of the second bonding pad 114 facing the first column 110A is aligned with an end of the sixth bonding pad 144 facing the first column 110A.

In the present embodiment, a length X1 of each first bonding pad 112 is different from a length X3 of each third bonding pad 116, a length X5 of each fifth bonding pad 142, and a length X7 of each seventh bonding pad 146. In the present embodiment, a length X2 of each second bonding pad 114 is different from a length X4 of each fourth bonding pad 118 and a length X8 of each eighth bonding pad 148. In the present embodiment, the length X2 of each second bonding pad 114 is equal to a length X6 of each sixth bonding pad 144. In the present embodiment, the length of each bonding pad P may be adjusted according to an actual requirement.

A first lead 212 includes a first extension portion 2122 and a first branch portion 2124 connected to the first extension portion 2122. The first extension portion 2122 overlaps a corresponding first bonding pad 112, and extends from the first column 110A to the second column 110B.

A second lead 214 includes a second extension portion 2142. The second extension portion 2142 overlaps a corresponding second bonding pad 114, and extends from the second column 110B to the first column 110A.

A third lead 216 includes a third extension portion 2162. The third extension portion 2162 overlaps a corresponding third bonding pad 116, and extends from the first column 110A to the second column 110B.

A fourth lead 218 includes a fourth extension portion 2182 and a fourth branch portion 2184 connected to the fourth extension portion 2182. The fourth extension portion 2182 overlaps a corresponding fourth bonding pad 118, and extends from the second column 110B to the first column 110A.

The fifth lead 252 includes a fifth extension portion 2522 and a fifth branch portion 2524 connected to the fifth extension portion 2522. The fifth extension portion 2522 overlaps a corresponding fifth bonding pad 142, and extends from the first column 110A to the second column 110B.

The sixth lead 254 includes a sixth extension portion 2542. The sixth extension portion 2542 overlaps a corresponding sixth bonding pad 144, and extends from the second column 110B to the first column 110A.

The seventh lead 256 includes a seventh extension portion 2562. The seventh extension portion 2562 overlaps a corresponding seventh bonding pad 146, and extends from the first column 110A to the second column 110B.

The eighth lead 258 includes an eighth extension portion 2582 and an eighth branch portion 2584 connected to the eighth extension portion 2582. The eighth extension portion 2582 overlaps a corresponding eighth bonding pad 148, and extends from the second column 110B to the first column 110A.

In the present embodiment, a gap GP is present between the first column 110A and second column 110B, and a width of the gap GP is equal to a shortest horizontal distance between the first column 110A and the second column 110B. The gap GP is located between a connection line of the end of the first bonding pad 112 facing the second column 110B and a connection line of the end of the second bonding pad 114 facing the first column 110A.

A length L1 of the first lead 212 overlapping the gap GP, a length L2 of the second lead 214 overlapping the gap GP, a length L3 of the third lead 216 overlapping the gap GP, a length L4 of the fourth lead 218 overlapping the gap GP, a length L5 of the fifth lead 242 overlapping the gap GP, a length L6 of the sixth lead 244 overlapping the gap GP, a length L7 of the seventh lead 246 overlapping the gap GP, and a length L8 of the eight lead 248 overlapping the gap GP are different from each other.

In the present embodiment, the gap GP includes a first region R1, a second region R2, and a third region R3 that have a same area and are connected in sequence. The first region R1 is located between the first column 110A and the second region R2. The third region R3 is located between the second column 110B and the second region R2. Areas of the connection end L overlapping the first region R1, the second region R2, and the third region R3 are B', A, and B respectively. The area B and the area B' may be the same or different. In the present embodiment, 1<A/B<3.6, which may better disperse stress in a press-fitting process, and improve utilization of cabling space. In some embodiments, 1<A/B'<3.6.

In some embodiments, areas of all the first region R1, the second region R2, and the third region R3 are AR, and $0.15 \leq (A+B+B')3AR<1/3$.

Based on the above, the first lead 212 of the device substrate 30 includes the first extension portion 2122 and the first branch portion 2124, and an angle is present between the first branch portion 2124 and the first extension portion 2122. Therefore, a problem of deformation in a region between the first bonding pads 112 and the second bonding pads 114 in a press-fitting process of the first bonding pads 112 and the first leads 212 of the device substrate 30 may be resolved, and a desired effect may be achieved in this design range.

What is claimed is:
1. A device substrate comprising:
a first substrate and a second substrate facing the first substrate;

a plurality of bonding pads separated from each other and located on the first substrate, and comprising:
  a plurality of first bonding pads and a plurality of second bonding pads, wherein the first bonding pads are arranged in a first column, and the second bonding pads are arranged in a second column; and
  a plurality of third bonding pads and a plurality of fourth bonding pads, located on the first substrate,
wherein the first bonding pads and the third bonding pads are arranged in the first column,
and the second bonding pads and the fourth bonding pads are arranged in the second column; and
a plurality of connection ends located on the second substrate, and comprising:
  a plurality of first leads and a plurality of second leads respectively overlapping the first bonding pads and the second bonding pads, wherein each of the first leads comprises:
    a first extension portion overlapping the corresponding first bonding pad and extending from the first column to the second column; and
    a first branch portion connected to an end of the first extension portion and forming an angle with the first extension portion; and
  a plurality of third leads and a plurality of fourth leads, located on the second substrate and respectively overlapping the third bonding pads and the fourth bonding pads,
wherein each of the second leads comprises:
  a second extension portion overlapping the corresponding second bonding pad and extending from the second column to the first column,
each of the third leads comprises:
  a third extension portion overlapping the corresponding third bonding pad and extending from the first column to the second column, and
each of the fourth leads comprises:
  a fourth extension portion overlapping the corresponding fourth bonding pad and extending from the second column to the first column; and
  a fourth branch portion connected to an end of the fourth extension portion and forming an angle with the fourth extension portion,
wherein a gap is present between the first column and the second column,
and the gap comprises a first region, a second region, and a third region which have a same area and are connected in sequence,
wherein the first region is located between the first column and the second region,
and the third region is located between the second column and the second region,
wherein areas of the connection ends overlapping the first region, the second region, and the third region are B', A, and B respectively, and 1<A/B<2.04.

2. The device substrate according to claim 1, wherein a length of each of the first leads overlapping the gap is different from a length of each of the third leads overlapping the gap, and a length of each of the second leads overlapping the gap is different from a length of each of the fourth leads overlapping the gap.

3. The device substrate according to claim 2, wherein a sum of the length of each of the first leads overlapping the gap and the length of each of the third leads overlapping the gap is equal to a sum of the length of each of the second leads overlapping the gap and the length of each of the fourth leads overlapping the gap.

4. The device substrate according to claim 1, wherein intervals between the first leads and the second leads are staggered with intervals between the third leads and the fourth leads.

5. The device substrate according to claim 1, wherein
  each of the first leads further comprises:
    a first divergent portion connected to the end of the first extension portion and forming an angle with the first branch portion, and
  each of the fourth leads further comprises:
    a fourth divergent portion connected to the end of the fourth extension portion and forming an angle with the fourth branch portion.

6. The device substrate according to claim 5, wherein the angle between the first branch portion and the first divergent portion is 10 degrees to 180 degrees, and the angle between the fourth branch portion and the fourth divergent portion is 10 degrees to 180 degrees.

7. The device substrate according to claim 1, wherein the angle between the first branch portion and the first extension portion is a right angle, and the angle between the fourth branch portion and the fourth extension portion is a right angle.

8. The device substrate according to claim 1, wherein an end of each of the first bonding pads facing the second column is aligned with an end of each of the third bonding pads facing the second column, and an end of each of the second bonding pads facing the first column is aligned with an end of each of the fourth bonding pads facing the first column.

9. The device substrate according to claim 1, wherein areas of the first region, the second region and the third region are all AR, and $0.15 \le (A+B+B')/3AR < 1/2$.

10. The device substrate according to claim 1, wherein a length of each of the first bonding pads is different from a length of each of the third bonding pads, and a length of each of the second bonding pads is different from a length of each of the fourth bonding pads.

11. The device substrate according to claim 1, wherein areas of the first region, the second region and the third region are all AR, and $0.15 \le (A+B+B')/3AR < 1/3$.

12. The device substrate according to claim 1, wherein a minimum spacing between two adjacent connection ends of the connection ends is greater than 4 micrometers and less than 80 micrometers.

13. The device substrate according to claim 1, wherein the first leads are bent to a first direction, the fourth leads are bent to a second direction, and the first direction is opposite to the second direction.

14. The device substrate according to claim 1, wherein the first bonding pads are aligned with the second bonding pads in an extension direction of the first bonding pads, and the third bonding pads are aligned with the fourth bonding pads in an extension direction of the third bonding pads.

15. The device substrate according to claim 1, wherein the first bonding pads are staggered with the second bonding pads, and the third bonding pads are staggered with the fourth bonding pads.

16. The device substrate according to claim 1, wherein an anisotropic conductive film is sandwiched between the connection ends and the bonding pads.

* * * * *